(12) United States Patent
Ghoshal

(10) Patent No.: US 6,222,113 B1
(45) Date of Patent: Apr. 24, 2001

(54) ELECTRICALLY-ISOLATED ULTRA-THIN SUBSTRATES FOR THERMOELECTRIC COOLERS

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/458,270

(22) Filed: Dec. 9, 1999

(51) Int. Cl.[7] .................................................. H01L 35/34
(52) U.S. Cl. .......................... 136/201; 136/203; 62/3.3; 62/3.61; 62/3.7
(58) Field of Search .................... 136/203, 204, 136/201, 236.1; 62/3.2, 3.3, 3.6, 3.61, 3.7

(56) References Cited

U.S. PATENT DOCUMENTS

| | | | |
|---|---|---|---|
| 4,855,810 | * 8/1989 | Gelb et al. | 136/203 |
| 5,429,680 | * 7/1995 | Fuschetti | 136/203 |
| 5,441,576 | * 8/1995 | Bierschenk et al. | 136/203 |
| 5,817,188 | * 10/1998 | Yahatz et al. | 136/203 |
| 5,867,990 | 2/1999 | Ghoshal | 62/3.7 |
| 5,966,941 | 10/1999 | Ghoshal | 62/3.7 |
| 6,000,225 | 12/1999 | Ghoshal | 62/3.7 |
| 6,103,967 | * 8/2000 | Cauchy et al. | 136/203 |

FOREIGN PATENT DOCUMENTS

| | | |
|---|---|---|
| PCT/GB98/ 03412 | 12/1999 | (WO) . |
| WO 00-08693 | 2/2000 | (WO) . |

OTHER PUBLICATIONS

Rinzler, A.G. et al.; Large–Scale Purification of Single–Wall Carbon Nanotubes: Process, Product and Characterization; 1998; pp. 29–37, No month and /or year given.

Liu, Jie et al.; Fullerene Pipes; Science; vol. 280; May 22, 1998, pp. 1253–1255, No month and/or year given.

Thess, Andreas et al.; Crystalline Ropes of Metallic Carbon Nanotubes; Science; vol. 273; Jul. 26, 1996; pp. 483–487, No month and/or year given.

Tubes @ Rice; Rice University; http://cnst.rice.edu/tubes/;, No month and/or year given.

An Introduction to Thermoelectrics; http://www.tellurex-.com/resource/introc.html, No month and/or year given.

Tellurex Corporation Frequently Asked Questions; http://www.tellurex.com/resource/txfaqc.html, No month and/or year given.

\* cited by examiner

*Primary Examiner*—Kathryn Gorgos
*Assistant Examiner*—Thomas H Parsons
(74) *Attorney, Agent, or Firm*—Duke W. Yee; Casimer K. Salys (57) ABSTRACT

Thermoelectric cooler for providing sub-ambient cooling to an object and method of fabricating same. In one form, the thermally conducting but electrically insulating substrate interfaces used in conventional thermoelectric coolers are replaced by ultra-thin semiconductor substrates having a plurality of doped regions. Diodes formed in the semiconductor substrates are maintained in a reverse biased state to provide the desired electrical isolation necessary for operating the thermoelectric coolers. The reverse biased state is maintained by either the inherent properties resulting from forming the diode in the semiconductor material or through application of a bias voltage to the semiconductor substrates though a layer of conductive material deposited on the outermost surfaces of the substrates.

42 Claims, 8 Drawing Sheets

ELECTRICALLY-ISOLATED ULTRA-THIN SUBSTRATES FOR THERMOELECTRIC COOLERS

CROSS REFERENCE TO RELATED APPLICATION

The present application is related to U.S. patent application Ser. No. 09/458,271 filed on Dec. 9, 1999, pending by common assignee and having the title "Thermoelectric Cooling Apparatus And Method For Maximizing Energy Transport" and being incorporated herein by reference.

BACKGROUND OF THE INVENTION

1. Field of the Invention

The present invention relates to cooling apparatuses and methods for making same. More particularly, the invention is directed to thermoelectric cooling apparatuses attaining high relative efficiency thermoelectric cooling through the use of thermally conducting, electrically insulating semiconductor based substrates.

2. Description of the Related Art

Sub-ambient cooling is conventionally accomplished through gas/liquid vapor phase compression based refrigeration cycles using Freon type refrigerants to implement the heat transfers. Such refrigeration systems are used extensively for cooling human residences, perishable items, and vehicles. Sub-ambient cooling is also often used with major electronic systems such as mainframe, server and workstation computers. Though vapor compression cooling can be very efficient, it does require significant moving hardware. Vapor compression cooling systems, at a minimum, include a compressor, a condenser, an evaporator, and related coolant transfer plumbing. As a result of the complexity and associated high cost, vapor compression cooling has not found material acceptance in small cooling applications, such as personal computers, integrated circuits, etc.

The fact that CMOS logic can operate significantly faster as the temperature decreases has been well known for many years. For example, when CMOS logic devices are operated at −50° C., their performance is improved by 50 percent over room temperature operation. Liquid nitrogen operating temperatures, in the range of −196° C., have shown 200 percent performance improvements. Similar benefits have been shown to accrue for integrated circuit wiring, where metal wiring resistance decreases by a factor of 2 for integrated circuits operated at −50° C. in comparison to room temperature operation. These performance improvements rival the recent technological breakthrough of using copper wiring in integrated circuits to reduce interconnect resistance and thereby effectively increase the operating frequencies attainable. Thus, sub-ambient temperature operation of integrated circuit logic devices, such as field effect transistors, as well as interconnect wiring can improve integrated circuit performance. This performance enhancement then poses the question of how to accomplish such cooling in the confines of the ever decreasing size and materially shrinking cost environment of microelectronics.

Figure 1:
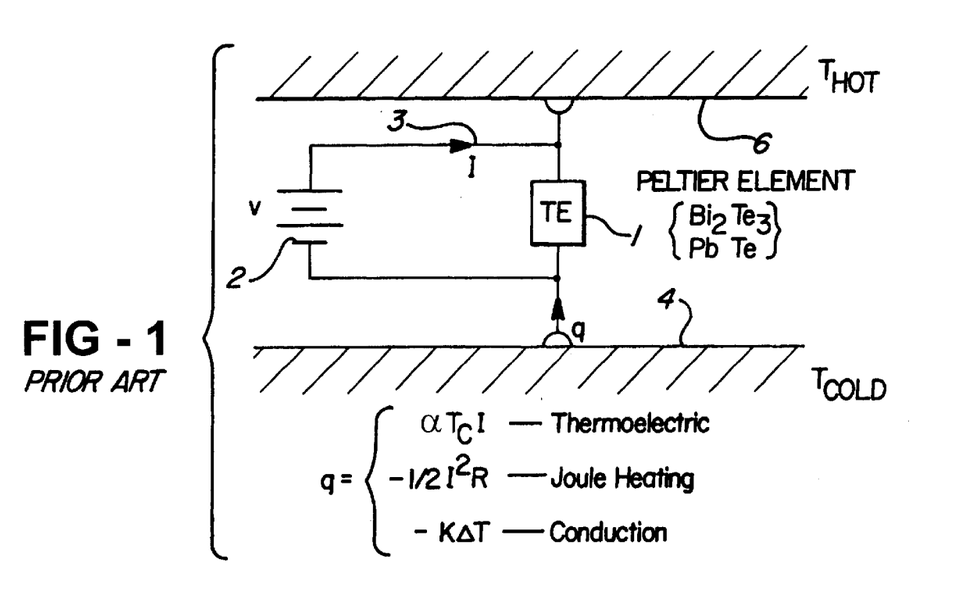
FIG. 1 schematically depicts a conventional statically operable Peltier device cooling system.

FIG. 1 schematically depicts a conventional Peltier type thermoelectric element (TE) 1 with DC power supply 2 creating the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - (\tfrac{1}{2}) I^2 R - K \Delta T \qquad (1)$$

High thermal conductivity is a desired characteristic of the substrates in thermoelectric coolers, such as thermal sinks 4 and 6. This high level of thermal conductivity reduces the thermal resistance of the substrate which, in turn, reduces the temperature drop across the substrate and therefore increases the heat transfer efficiency of the thermoelectric cooler. In addition to providing high levels of thermal conductivity, the substrates must also be electrically insulating. Electrically insulating substrates are used to ensure electrical isolation of the thermoelements in a thermoelectric cooler while providing appreciable thermal conduction. It is also desirable to make the substrates used to fabricate thermoelectric coolers as thin as possible to minimize the temperature drop across the substrate to thereby maximize the efficiency of the thermoelectric cooler.

Conventional thermoelectric coolers utilize berylia (BeO) ceramic substrates which are thermally conducting and electrically insulating. BeO has a high thermal conductivity, approximately 320 W/m-K, however, it is difficult to fabricate and use thin BeO substrates. The brittle nature of a BeO substrate makes it susceptible to fractures when thinned to less than 1 millimeter. Therefore, typical BeO substrates are limited to thicknesses of between 2 and 4 millimeters. As a result, temperature drops of only 25 K to 30 K or greater can be achieved for high heat flux condition. BeO substrates are further limited by their inability to allow the growth of advanced thermoelectric lattices as well as by the fact that the thermal expansion of BeO is not matched with silicon, the material used in the fabrication of most processors and integrated circuits.

Alternatives, such as silicon-on-insulator (SOI) wafers and diamond thin films or silicon-on-diamond (SOD) wafers, have been considered, but with each alternative comes different limitations. For example, the silicon dioxide layer in SOI wafers has a very low, approximately 1 W/m-K, thermal conductivity which translates to a high thermal resistance of the substrate. SOD wafers, on the other hand, have high costs associated with their use. For example, 500 micron diamond films cost around $90 per square centimeter and are expensive to process due to their rough surfaces and graphite formations at the grain boundaries.

There presently exists a need for thin film implementations and minitarization of thermoelectric cooler substrates. Thin film implementations and minitarization of thermoelectric cooler substrates would provide high cooling flux scaling with the smaller geometries to provide cooling in the range of 50 to 100 W/cm² with high entropy gradients and lower thermal conductivities. Use of thin film implementations would yield higher reliability in the order of MTBF (mean time between failures) of greater than $10^6$ hours, lower cost in the order of less than 10¢/W and ease of constructing of multistage configurations wherein microcoolers can be operated in parallel for large cooling capacity and high efficiency.

Thus present thermoelectric cooler substrates limit the ability to achieve relative low temperature drops and thereby limit the use, scalability and efficiency of thermoelectric coolers and improved substrates are needed which overcome these limitations.

SUMMARY OF THE INVENTION

The present invention overcomes the limitations of presently used thermoelectric cooler substrates by forming and using thermally conductive semiconductor based substrates having doped regions providing electrically insulating properties.

In one form, the invention relates to a thermoelectric cooling apparatus comprising at least one thermal sink, at least one thermoelectric cooling element situated to be coupled to the thermal sink and wherein the thermal sink comprises a semiconductor material having a plurality of doped regions.

In another form, the invention relates to a method of fabricating a thermoelectric cooling apparatus comprising forming at least one thermal sink of a semiconductor material having a plurality of doped regions and coupling a thermoelectric element to thermal sink.

In still another form, the invention relates to a thermal sink situated to be coupled to a thermoelectric element comprising a semiconductor material having a plurality of doped regions.

In still another form, the invention relates to a method of fabricating a thermal sink adapted to be coupled to a thermoelectric element of a thermoelectric cooling apparatus comprising providing a semiconductor material and forming a plurality of doped regions in the semiconductor material.

In a particularized form of the invention, at least one thermoelectric element, such as a peltier device, is coupled to thermal sinks comprised of a semiconductor material such as silicon, having doped regions forming diodes. The diodes are reverse biased to electrically isolate the thermal sinks from the other components in the thermoelectric cooling apparatus environment. To ensure that the reverse biased condition is maintained, a bias voltage may be applied to the thermal sinks.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures.

DETAILED DESCRIPTION OF A PREFERRED EMBODIMENT

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual ground work for the present invention involves using thermally conductive semiconductor-based thermal sinks or interfaces having doped regions forming electrical isolation devices/circuits. In this manner, the thickness of the thermal sinks can be minimized to reduce the temperature drop across the thermal sinks thus maximizing efficiency of a thermoelectric cooler using such sinks. While minimizing the thickness of the thermal sinks, the electrical isolation devices/circuits provide the electrical insulation properties needed for proper operation and use of the thermoelectric cooler.

Figure 2:
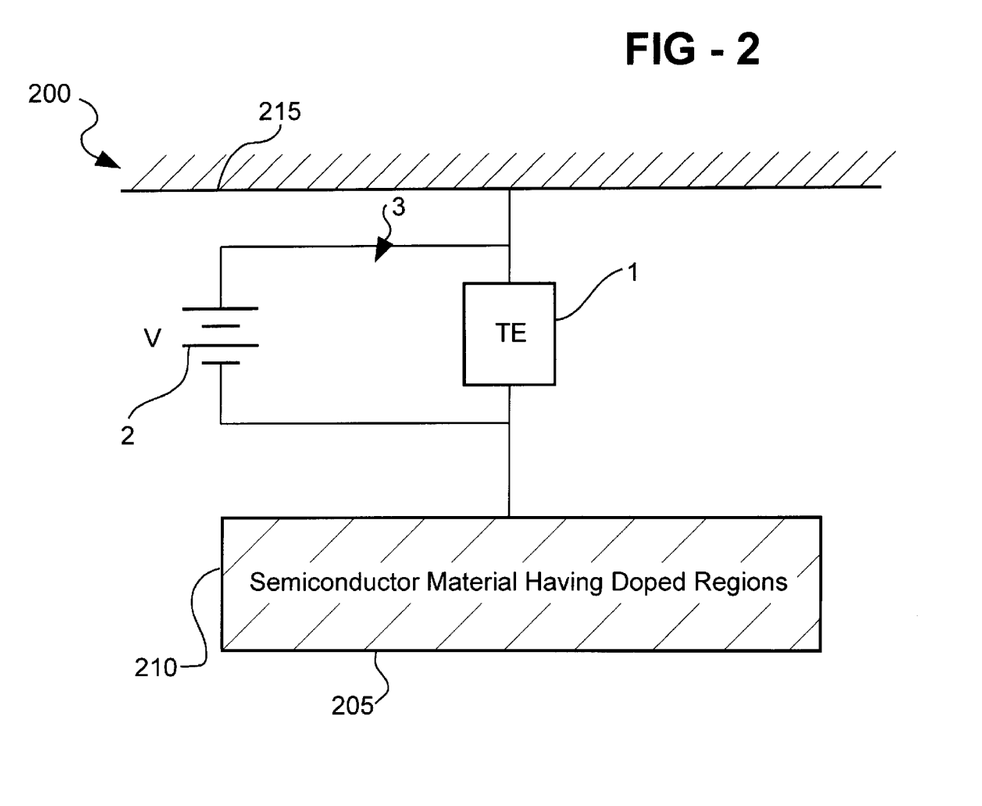
FIG. 2 schematically depicts a thermoelectric cooling apparatus according to one embodiment of the present invention.

Referring now to FIG. 2, an illustration of a minimum thermoelectric element thermoelectric cooling apparatus employing the concepts of present invention is shown. Reference numerals used in FIG. 2 which are like, similar or identical to reference numerals used in FIG. 1 indicate like, similar or identical components. Thermoelectric cooling apparatus 200 comprises a thermal sink 205 of thermally conductive semiconductor material. Thermal sink 205 has, within thickness 210, a plurality of doped regions. The present invention anticipates employing a variety of semiconductor materials including, but not limited to silicon or germanium and a variety of doped regions using a variety of dopants. Using the plurality of doped regions, various components can be created. For example, the doped regions can be used to form electrical isolation devices/circuits, discrete devices such as diodes or integrated circuits capable of controlling various components or performing other functions. In a preferred embodiment of the invention, the plurality of doped regions within thermal sink 205 form electrical isolation devices/circuit(s) to provide the electrical insulation properties needed for proper operation of thermoelectrical cooling apparatus 200. Thermal sink 215, as illustrated, is made from conventional materials, such as berylia, however, thermal sink 215 could be fabricated from a semiconductor material having a plurality of doped regions similar to thermal sink 205.

Figure 3:
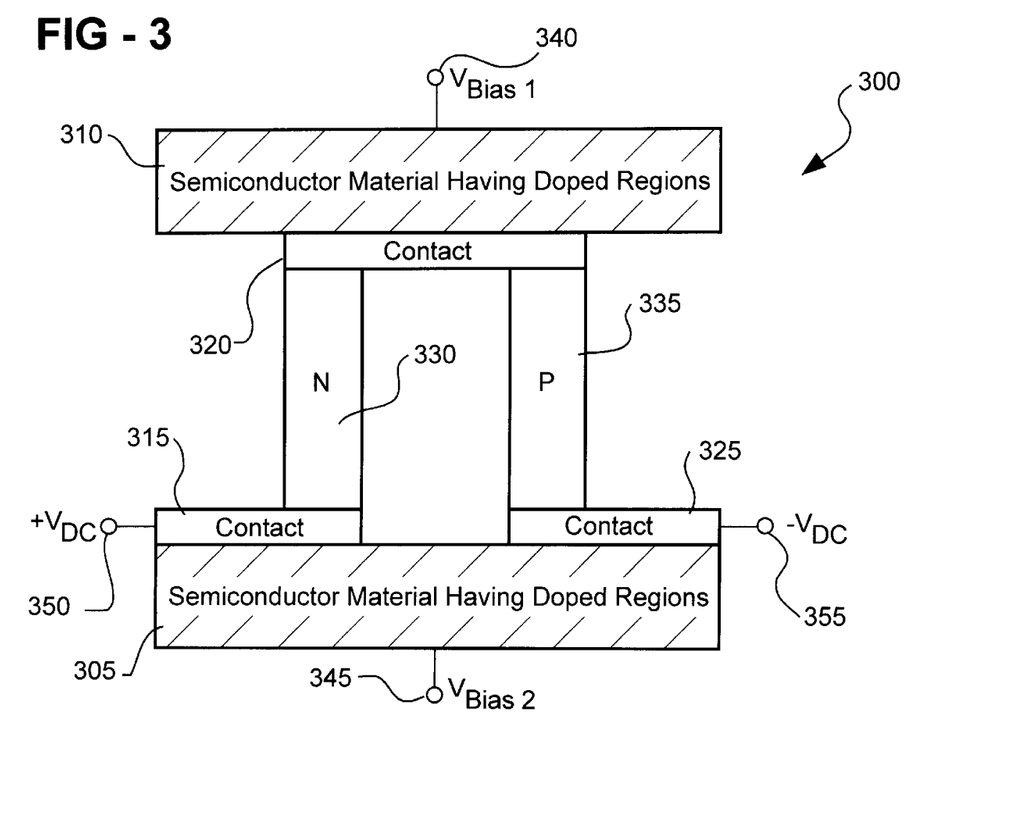
FIG. 3 illustrates a block diagram of a thermoelectric cooling apparatus according to another embodiment of the present invention.

Referring now to FIG. 3, a diagram showing a multiple thermoelectric element thermoelectric cooling apparatus 300 according to a preferred embodiment of the present invention is shown. Thermoelectric cooling apparatus 300 includes thermal sinks 305, 310 of thermally conductive semiconductor material having doped regions identical to thermal sink 205 described in connection with FIG. 2. Thermal sinks 305 and 310 provide the platform for the thermoelectric elements and any required contacts which couple the thermoelectric elements used in thermoelectric cooling apparatuses. Thermal sinks 305 and 310 thermally conduct to transfer heat from respective opposite sides of thermoelectric cooling apparatus 300.

A series of contacts 315, 320 and 325 are present on the inner surfaces of thermal sinks 305 and 310. These contacts can be made from a Copper/Platinum plated material, a Copper/Nickel plated material or any other effective material. Contact 315 and one end of contact 320 are used to mount and couple thermoelectric element or n-type semiconductor pellet 330 to thermal sinks 305, 310, respectively. The opposite end of contact 320 and contact 325 are used to mount and couple thermoelectric element or p-type semiconductor pellet 335 to thermal sinks 305, 310, respectively. The connections illustrated in FIG. 3 illustrate a series electrical connection and a parallel thermal connection of thermoelectric elements 330 and 335. Thermoelectric elements 330 and 335 can be produced using a variety of methodologies. In one embodiment, thermoelectric elements 330 and 335 are formed from thin-film superlattices as disclosed in U.S. patent application Ser. No. 09/458,271 titled "THERMOELECTRIC COOLING APPARATUS AND METHOD FOR MAXIMIZING ENERGY TRANSPORT," herein incorporated by reference.

In order for thermal sinks 305 and 310 to be electrically isolated from their environment, junctions formed by the doped regions within the semiconductor material used to construct thermal sinks 305, 310 as described above in connection with FIG. 2 are reversed biased. This reverse biasing may be accomplished by employing a variety of techniques. One such technique involves applying bias voltages $V_{BIAS1}$, $V_{BIAS2}$ to each thermal sink 305 and 310 as indicated at 340 and 345. The goals and other methods of reverse biasing will be explained in more detail with reference to FIG. 4 below.

Thermoelectric cooling apparatus 300 functions by applying a DC voltage to contacts 315 and 325. The direction of heat flow and current flow will be determined by the polarity of the voltage applied at contacts 315 and 325. For example, by applying a positive DC voltage 350 at contact 315 and a negative DC voltage 355 at contact 325, current will flow from contact 315, up n-type semiconductor pellet 330, through contact 310, down p-type semiconductor pellet 335 and through contact 325. Consequently, heat will be transferred from thermal sink 310 to thermal sink 305 for dissipation.

Figure 4:
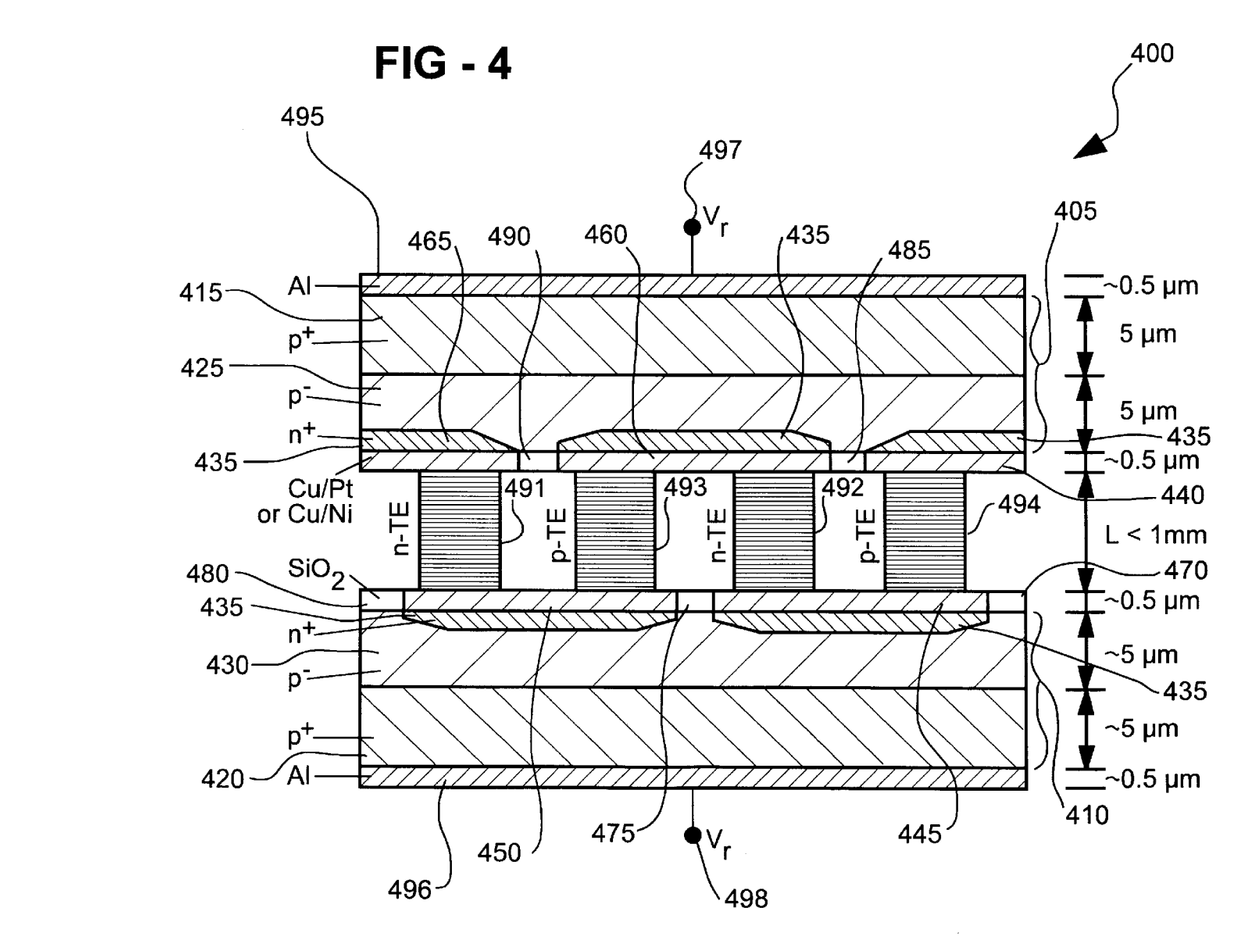
FIG. 4 illustrates a thermoelectric cooling apparatus according to a preferred embodiment of the present invention.

Referring now to FIG. 4, a thermoelectric cooling apparatus according to a preferred embodiment of the present invention is illustrated. Thermoelectric cooling apparatus 400 is made using the semiconductor-based thermal sinks having doped regions as discussed above. A first thermal sink is located at 405 and a second thermal sink is located at 410. As illustrated, thermal sinks 405 and 410 are formed by an approximately 5 micron thick p+ type material, regions 415 and 420 respectively, and an approximately 5 micron thick p– type material, regions 425 and 430 respectively. Also indicated in FIG. 4 is the presence of the series of n+ type regions 435.

Deposited onto the surfaces of the n+ type regions 435 is a material which is effective for electrical contacts as well as mounting thermoelectric elements for thermoelectric cooling apparatus 400. In the illustration, either a Copper/Platinum plated (Cu/Pt) alloy or Copper/Nickel plated (Cu/Ni)alloy is indicated. The contacts, 440, 445, 450, 460 and 465 are electrically and thermally isolated by the presence of the Silicon Dioxide ($SiO_2$) dielectric indicated at 470, 475, 480, 485 and 490. Contacts, 440, 445, 450, 460 and 465 are formed to be approximately 0.5–20 microns thick.

Thermoelectric cooling apparatus 400 uses thermal sinks 405 and 410 in conjunction with an array of thermoelectric elements. As mentioned above, the thermoelectric elements discussed herein can be created from thin film superlattice structures, doped semiconductor pellets, Peltier devices, as well as by other means. In the illustrated configuration, two n-type thermoelectric elements, 491 and 492, and two p-type thermoelectric elements, 493 and 494, having thicknesses of in the order of 30 microns are employed. To create a series electrical connection between each of the elements 491, 492, 493, 494, contact 465 is connected to one end of n-type element 491. The opposite end of n-type element 491 is connected to contact 450 which is also connected to one end of p-type element 493. The opposite end of p-type element 493 is connected to contact 460 which is also connected to one end of n-type element 492 whose opposite end is connected to contact 445. Contact 445 is connected to one end of p-type element 494 whose opposite end is connected to contact 440 in order to complete the series connection. Similar to the explanation of current flow above, this series connection allows current to flow through contact 465, down n-type element 491, through contact 450, up p-type element 493, through contact 460, down n-type element 492, through contact 445, up p-type element 494, and through contact 440 to transfer heat from thermal sink 410 to thermal sink 405. Properly applying a DC voltage enables thermoelectric cooling apparatus 400 to transfer thermal energy. By applying a positive DC potential to contact 465 and a negative DC potential to contact 440, thermal energy will be transferred from thermal sink 410 to thermal sink 405 for dissipation.

The n+/p–/p+ junctions created in the silicon substrate and present at each of contacts 440, 445, 450, 460, and 465 form diodes and, therefore, have a reverse bias voltage and breakdown voltage associated with them. The reverse bias voltage and breakdown voltage associated with each diode is dependent on a variety of factors including doping levels. The specific values of these voltages are not significant for purposes of the present discussion.

The major concern with the presence of these diodes is current leakage or lack of electrical isolation. Current leakage, and therefore electrical conductivity, can occur when these diodes become forward biased or when the breakdown voltage is reached or exceeded. When the diodes created by the n+/p–/p+ junctions are forward biased or when the breakdown voltage is reached or exceeded, thermal sinks 405 and 410 become electrically conductive and thus prevent current from flowing solely through its intended path of contacts and thermoelectric elements only.

To prevent this current leakage from occurring and thus establish electrical isolation, the n+/p–/p+ junctions are kept in a reversed biased condition. This reverse biased condition ensures that current will be able to flow anywhere but through the intended path of contacts and thermoelectric elements. Reverse biasing of the n+/p−/p+ junctions can be achieved and maintained by applying an appropriate DC voltage to contacts 497 and 498 on approximately 0.5 micron thick metal (e.g. aluminum or copper) layers 495 and 496. By applying the appropriate DC voltage at contacts 497 and 498, the threshold voltage of the n+/p−/p+ junctions can be raised. Thus, voltage is applied at contacts 497 and 498 such that current will only flow along its intended path and thermoelectric cooling apparatus 400 will remain electrically isolated from its ambient or environment.

In the following paragraphs a preferred method of fabricating a thermoelectric cooling apparatus and thermal sinks according to present invention will be described.

First, a semiconductor wafer is prepared using conventional bulk CMOS processing techniques. Substrate preparation begins by selecting a p+ type silicon wafer in which the p+ dopant levels meet desired requirements. It should be noted that any similarly enabled semiconductor substrate can also be used in the place of silicon. Once a p+ type silicon wafer has been prepared for processing, p− type layer or region is epitaxially grown or diffused on the p+ type wafer. In the preferred embodiment of the present invention, the p− type layer extends approximately 5 microns from the p+ type silicon wafer and is substantially evenly distributed throughout the wafer's thickness.

Next the p− type layer is coated with photoresist and patterned to form a n+ type layer. The n+ type layer is formed using ion-implantion processing techniques. The photoresist is then removed and the implanted n+ type layer annealed.

Finally an approximately 1 micron layer of Aluminum is deposited onto the exposed surface of the p+ layer.

Contacts are formed by first evaporating 250 Angstroms of chrome and then 0.5 microns of copper onto the exposed surfaces of p− type and n+ type layer. Next, 40 microns of Riston is applied and patterned to form the contacts. Using reactive ion etching (RIE), the Riston is etched away to form the contacts. 20 microns of copper is plated and then 2.5 mm of Ni or P+ to form a total plated height of about 1 mil. RIE is then used to thin remaining Riston to be even with the exposed surfaces of newly formed plated copper contacts.

Figure 5:
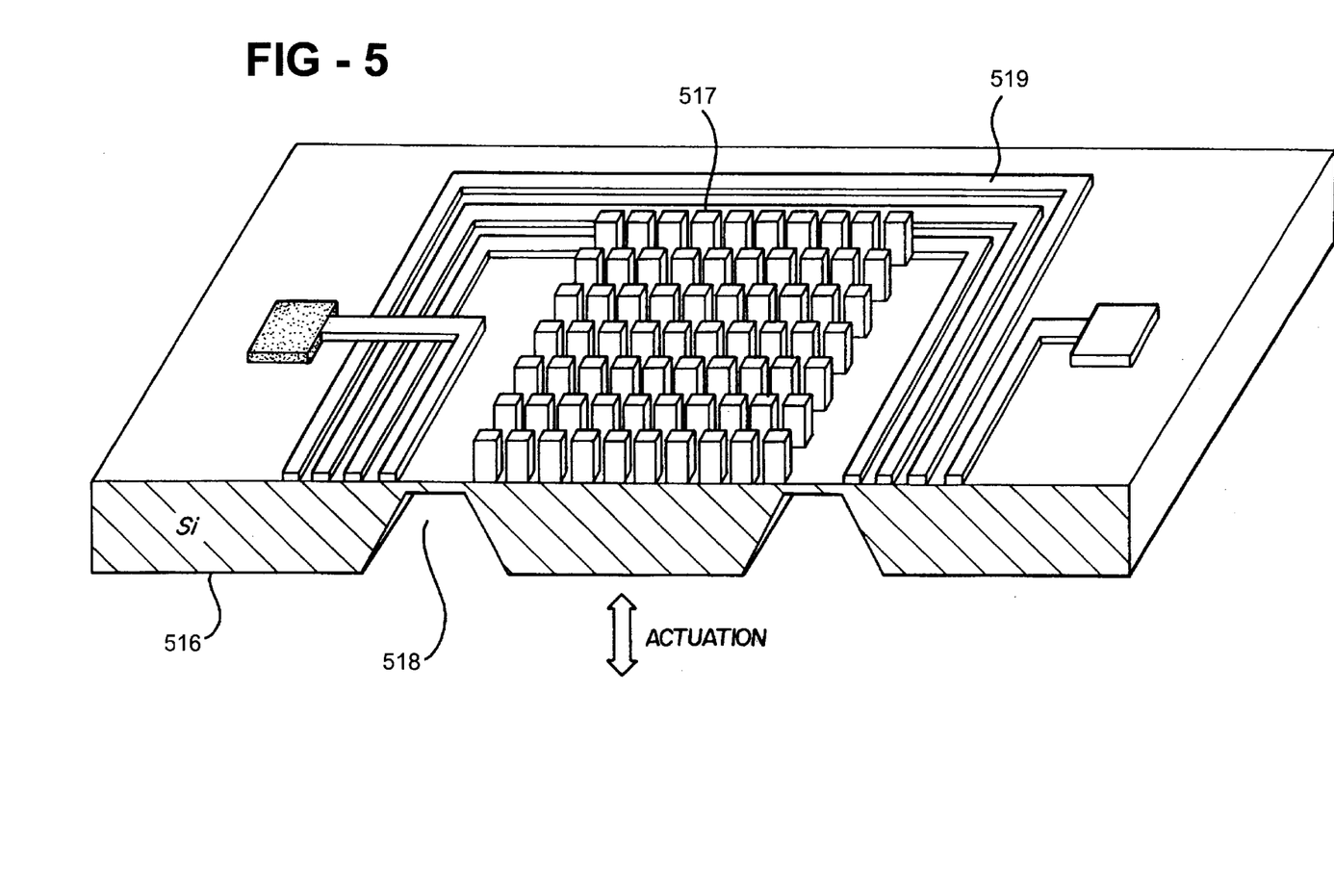
FIG. 5 schematically depicts a microelectromechanical systems (MEMS) device.

FIG. 5 schematically illustrates the structure of a representative microelectromechanical systems (MEMS) switch of the type particularly suited to be used with the present invention. For a further discussion and description of MEMS and the uses and applications of MEMS see pending U.S. patent application Ser. No. #08/988,621 and U.S. Pat. No. 5,867,990 issued Feb. 9, 1999 to common inventor and assignee as the present application and which are hereby incorporated by reference. Since MEMS technology is still in its infancy, the switch depicted in FIG. 5 merely illustrates one of many potential switch configurations suitable to provide a selective electrical and thermal coupling between the thermoelectric element and the sinks. The switch shown in FIG. 5 is fabricated using conventional integrated circuit techniques so as to form on a surface of silicon chip 516 an array of nickel magnets 517 amenable to a slight displacement by movement at thin flexible membranes 518. Introduction of an electrical current into spiral coil 519 produces a force adequate to translate the magnetic array in a direction perpendicular to the plane of the silicon chip. The MEMS switch in FIG. 5 should have a relatively low thermal conductivity when opened yet a relatively high electrical and thermal conductivity when closed by actuation. Since the MEMS device in FIG. 5 is to accomplish both electrical and thermal switching, numerous evolutionary refinements are expected to accentuate the dual functions.

Figure 6:
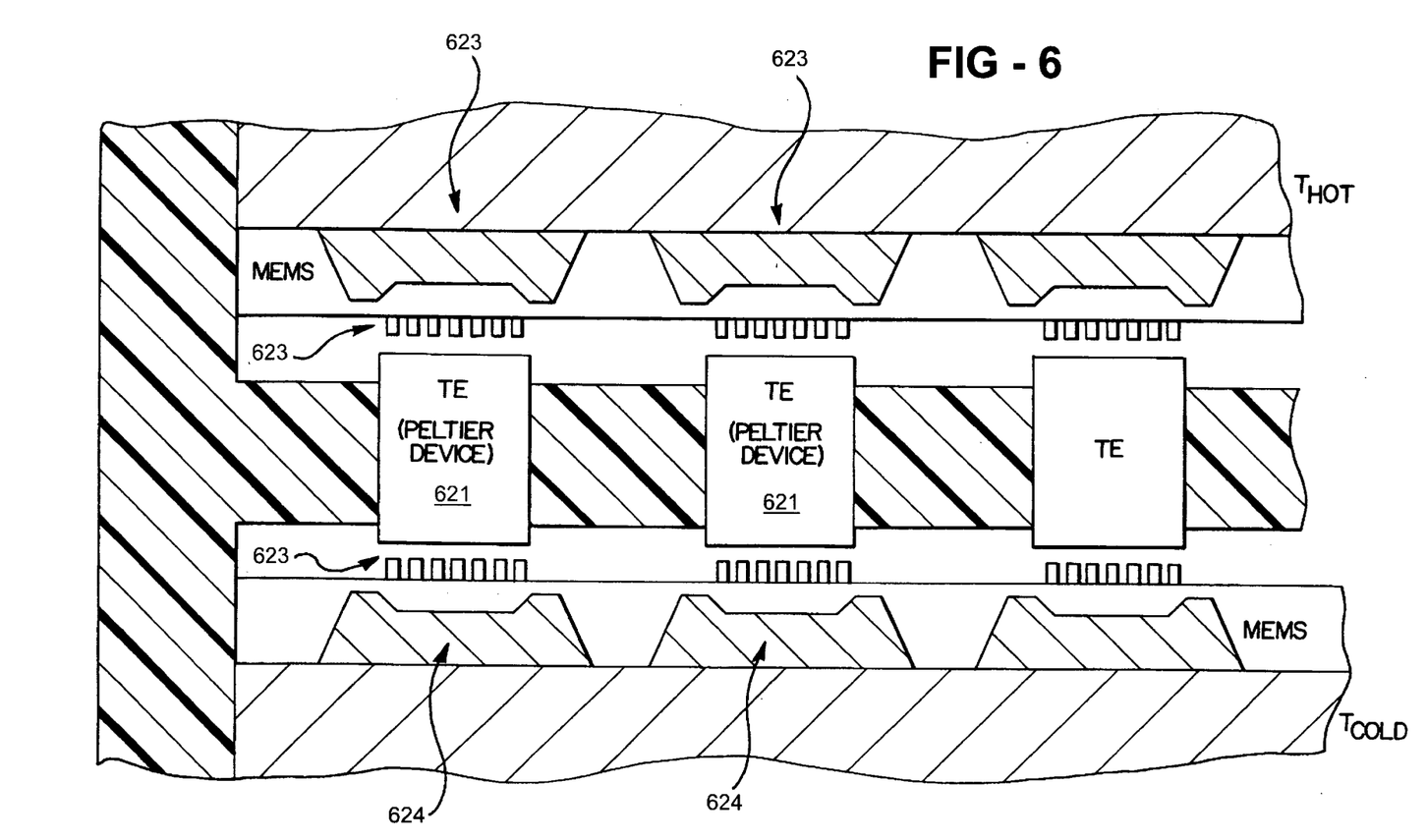
FIG. 6 depicts by schematic cross-section an array of MEMS devices and Peltier type thermoelectric elements.

FIG. 6 illustrates the use of an array of MEMS devices to selectively establish electrical and thermal connections between the Peltier type thermoelectric devices and thermal sinks of the present invention. The spacing between thermoelectric elements 621 and magnetic arrays 622 of hot and cold sink MEMS switches 623 and 624, respectively, is expected to be in the nominal range of half a micron. This dimension is expected to allow a nominal size electrical coil 519 (FIG. 5) to initiate actuation of the switch structures. Since switch cycling is expected to occur in the order of seconds, the reliability associated with kilohertz frequency switching of MEMS devices should not be a problem.

The MEMS type thermal switch described with reference to the illustrations in FIGS. 5 and 6 is merely one of many potential switch configurations. For example, it is fully contemplated that electrostatic forces generated in capacitive switch structures could be used to accomplish similar objectives. The underlying goal for all the switches is to maximize the thermal conductivity extremes for switch positions, such that when the switch is closed the thermal path between the thermoelectric element and the sink has a maximum thermal conductance while for the open switch the thermal conductance is the minimum attainable, while minimizing electrical condition Joule heating and maximizing the extremes of the electrical switch states.

The depiction in FIG. 6 portrays a plurality of thermoelectric elements and MEMS switches configured in arrays. The multiplicity of thermoelectric elements and switches ensures that the transient characteristics which underlie the present invention can be achieved within the dimensions of the thermoelectric element and switch materials. Stated otherwise, it is expected that the isolation of the thermoelectric heat transfer from the Joule heating and conduction components is most effectively accomplished with relatively small thermal capacity thermoelectric elements, commonly Peltier devices, and correspondingly small MEMS type switches.

Figure 7:
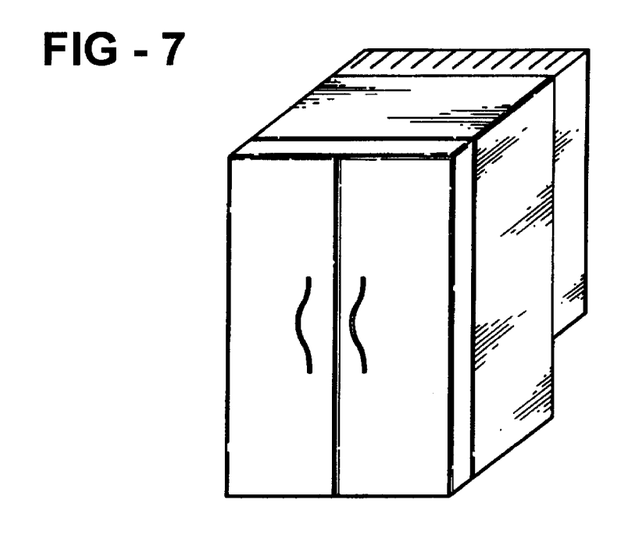
FIG. 7 schematically depicts the extended use of the invention to a food refrigeration system.

FIG. 7 schematically illustrates the use of the present invention in an extended array form to efficiently and cleanly operate a food refrigerator. The high efficiency of an apparatus utilizing a mechanical and thermoelectric cooling system in characterizing the present invention facilitates the migration of mixed cooling from highly selective and limited applications, such as mainframe computer system cooling, to major appliances in substantially every home.

Figure 8:
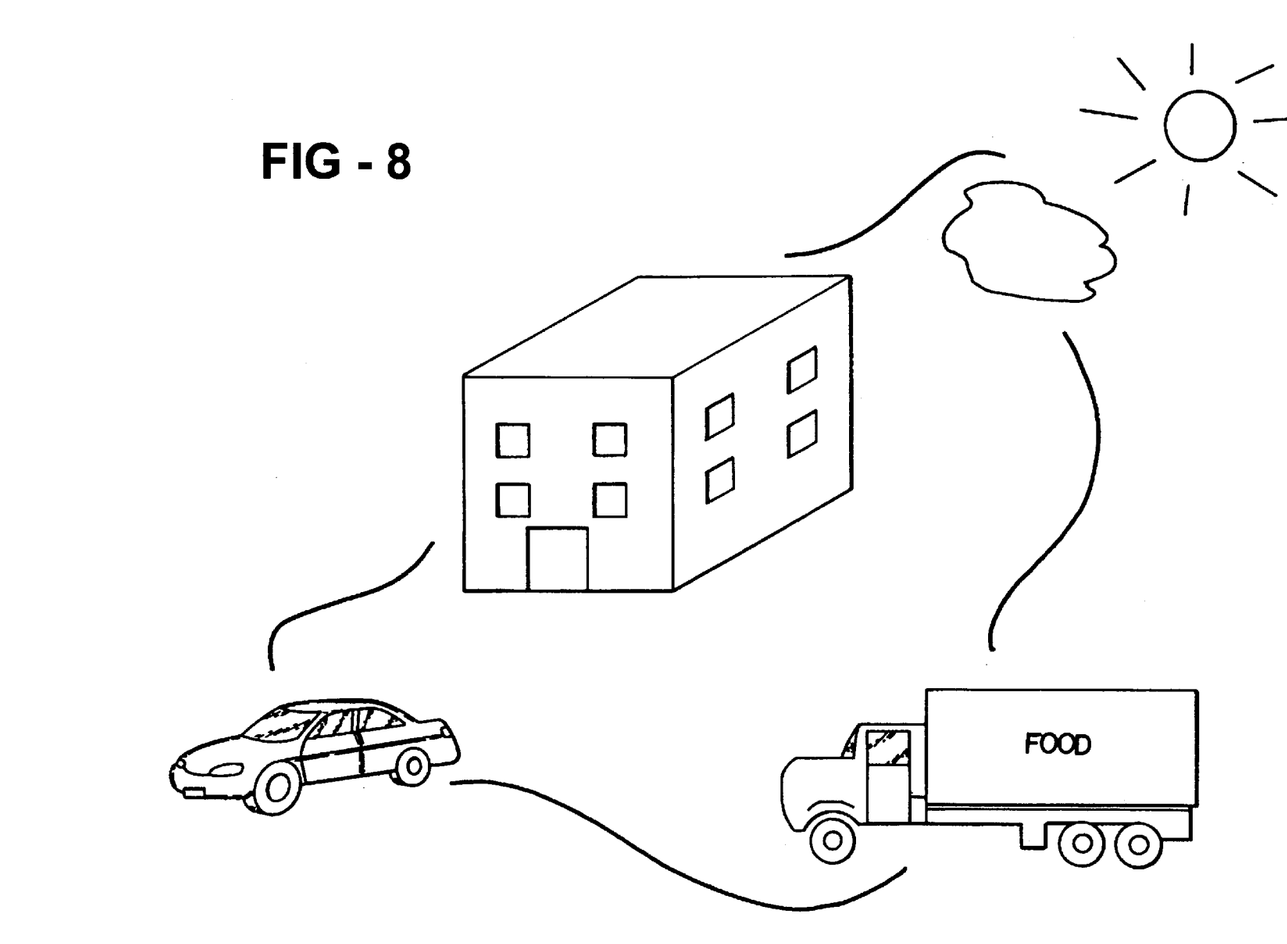
FIG. 8 schematically depicts potential applications and benefits of the invention as applied to various human residences and transportation media.

Still further applications are schematically depicted in FIG. 8, as the concepts underlying the present invention are further refined and extended in size to encompass major heat transfer applications encompassing residential and office cooling, food transportation systems, and personal vehicle cooling.

Figure 9:
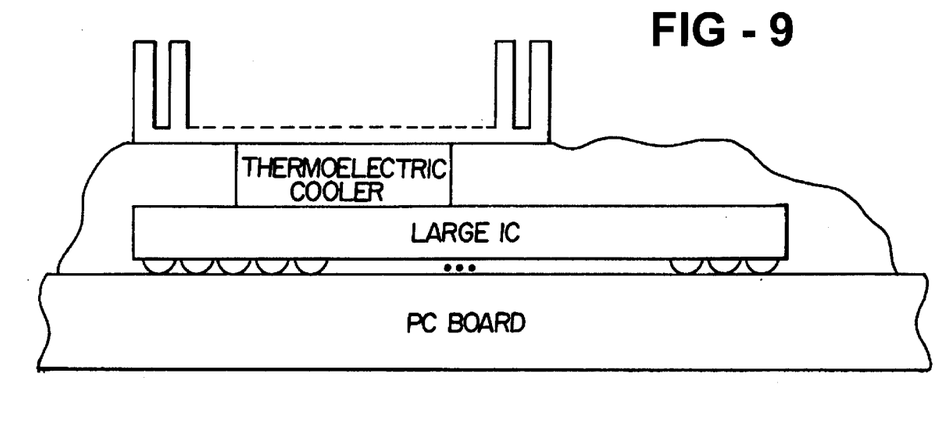
FIG. 9 schematically depicts the application of a small thermoelectric cooler to locally cool a selected part of an integrated circuit chip.

FIG. 9 schematically illustrates an application somewhat at the other end of the spectrum, where a micro size cooling apparatus is selectively bonded to parts of an integrated circuit chip for purposes of selective region cooling to control integrated circuit parameters. Such localized or spot cooling applications are particularly useful for voltage controlled oscillators, phase dectectors, mixers, low noise amplifiers, lasers, photodiodes, and various material type optoelectric circuits.

The present invention has very broad applicability. The invention utilizes semiconductor material having a plurality of doped regions for the thermally conductive but electrically insulating interfaces/thermal sinks of thermoelectric coolers to minimize the temperature drop across the interfaces/thermal sinks to thereby attain higher cooling efficiency.

It will be understood by those skilled in the art that the embodiments set forth hereinbefore are merely exemplary of the numerous arrangements for which the invention may be practiced, and as such may be replaced by equivalents without departing from the invention which will now be defined by appended claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A thermoelectric cooling apparatus comprising:
   at least one thermal sink;
   at least one thermoelectric cooling element situated to be coupled to said thermal sink; and wherein said thermal sink comprises a semiconductor material having a plurality of doped regions.

2. The thermoelectric cooling apparatus, as claimed in claim 1, wherein said doped regions form at least one diode.

3. The thermoelectric cooling apparatus, as claimed in claim 2, wherein said at least one diode is reverse biased.

4. The thermnoelectric cooling apparatus, as claimed in claim 1, wherein said doped regions form one or more discrete electrical devices.

5. The thermoelectric cooling apparatus, as claimed in claim 1, wherein said doped regions form one or more integrated circuits.

6. The thermoelectric cooling apparatus, as claimed in claim 5, wherein said integrated circuits are capable of controlling the operation of said thermoelectric cooling apparatus.

7. The thermoelectric cooling apparatus, as claimed in claim 1, wherein the thickness of said thermal sink is less than 10 microns.

8. The thermoelectric cooling apparatus, as claimed in claim 1, wherein the thickness of said thermal sink is less than 1 millimeter.

9. The thermoelectric cooling apparatus, as claimed in claim 1, further comprising:
   a second thermoelectric element; and
   a junction positioned between and coupled to said thermoelectric element and said second thermoelectric element.

10. The thermoelectric cooling apparatus, as claimed in claim 9, wherein said junction is said thermal sink.

11. The thermoelectric cooling apparatus, as claimed in claim 1, wherein said thermoelectric element is a peltier device.

12. The thermoelectric cooling apparatus, as claimed in claim 1, wherein said thermoelectric cooling apparatus is associated with at least one vehicle integrated circuit device.

13. The thermoelectric cooling apparatus, as claimed in claim 1, wherein said thermoelectric cooling apparatus is associated with at least one vehicle occupant cooling system.

14. The thermoelectric cooling apparatus, as claimed in claim 1, wherein said thermoelectric cooling apparatus is associated with at least one food refrigeration system.

15. The thermoelectric cooling apparatus, as claimed in claim 1, wherein said thermoelectric cooling apparatus is associated with at least one microelectromechanical system (MEMS).

16. The thermoelectric cooling apparatus, as claimed in claim 1, further comprising:
   a first thermal sink of a first nominal temperature;
   a second thermal sink of a second nominal temperature being relatively greater than the first temperature; and wherein said thermoelectric element is situated to be coupled to said first and second thermal sinks;
   and wherein at least one of said first and second thermal sinks comprises a semiconductor material having a plurality of doped regions.

17. A method of fabricating a thermoelectric cooling apparatus comprising:
   forming at least one thermal sink of a semiconductor material having a plurality of doped regions; and
   coupling a thermoelectric element to the thermal sink.

18. The method, as claimed in claim 17, further comprising:
   forming a diode in the semiconductor material of the thermal sink.

19. The method, as claimed in claim 18, further comprising:
   enabling the diode in a reverse biased state.

20. The method, as claimed in claim 17, further comprising:
   forming one or more discrete electrical devices in the semiconductor material of the thermal sink.

21. The method, as claimed in claim 17, further comprising:
   forming one or more integrated circuits in the semiconductor material of the thermal sink.

22. The method, as claimed in claim 21, further comprising:
   enabling the integrated circuits to control the operation of said thermoelectric cooling apparatus.

23. The method, as claimed in claim 17, further comprising:
   forming a junction positioned between and coupled to the thermoelectric element and a second thermoelectric element.

24. The method, as claimed in claim 23, wherein the junction is the thermal sink.

25. The method, as claimed in claim 17, wherein the thermoelectric element is a peltier device.

26. The method, as claimed in claim 17, wherein the step of forming the thermal sink includes the step of forming the thermal sink having a thickness less than 10 microns.

27. The method, as claimed in claim 17, wherein the step of forming the thermal sink includes the step of forming the thermal sink having a thickness less than 1 millimeter.

28. A thermal sink situated to be coupled to a thermoelectric element comprising a semiconductor material having a plurality of doped regions.

29. The thermal sink, as claimed in claim 28, wherein said doped regions form at least one diode.

30. The thermal sink, as claimed in claim 29, wherein said at least one diode is reverse biased.

31. The thermal sink, as claimed in claim 28, wherein said doped regions form one or more discrete electrical devices.

32. The thermal sink, as claimed in claim 28, wherein said doped regions form one or more integrated circuits.

33. The thermal sink, as claimed in claim 32, wherein said integrated circuits are capable of controlling the operation of said thermoelectric element.

34. The thermal sink, as claimed in claim 28, wherein the thickness of said thermal sink is less than 10 microns.

35. A method of fabricating a thermal sink adapted to be coupled to a thermoelectric element of a thermoelectric cooling apparatus comprising:

provide a semiconductor material; and forming a plurality of doped regions in the semiconductor material.

36. The method, as claimed in claim 35, further comprising:

forming a diode in the semiconductor material.

37. The method, as claimed in claim 35, further comprising:

forming one or more discrete electrical devices in the semiconductor material.

38. The method, as claimed in claim 35, further comprising:

forming one or more integrated circuits in the semiconductor material.

39. The method, as claimed in claim 35, further comprising:

forming a contact on the semiconductor material for coupling the thermal sink to the thermoelectric element.

40. The method, as claimed in claim 35, further comprising:

forming a conductive layer on the semiconductor material for coupling the thermal sink to an object.

41. The method, as claimed in claim 35, wherein the thickness of the thermal sink is less than 10 microns.

42. The method, as claimed in claim 35, wherein the thickness of the thermal sink is less than 1 millimeter.

* * * * *

UNITED STATES PATENT AND TRADEMARK OFFICE
CERTIFICATE OF CORRECTION

PATENT NO. : 6,222,113 B1
DATED : April 24, 2001
INVENTOR(S) : Ghoshal

It is certified that error appears in the above-identified patent and that said Letters Patent is hereby corrected as shown below:

Column 9,
Line 27, "thermnoelectric" should be -- thermoelectric --.

Signed and Sealed this

Eleventh Day of December, 2001

Attest:

*Attesting Officer*

NICHOLAS P. GODICI
*Acting Director of the United States Patent and Trademark Office*